(12) United States Patent
Hong et al.

(10) Patent No.: US 11,822,755 B2
(45) Date of Patent: Nov. 21, 2023

(54) ELECTRONIC DEVICE COMPRISING SENSING PATTERN

(71) Applicant: SAMSUNG DISPLAY CO., LTD., Yongin-si (KR)

(72) Inventors: Jung-Moo Hong, Seongnam-si (KR); Gyung-Min Ko, Cheonan-si (KR); Sungkyun Park, Hwaseong-si (KR); Sanghyun Jun, Suwon-si (KR); Yejoo Jun, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/725,900

(22) Filed: Apr. 21, 2022

(65) Prior Publication Data
US 2023/0041492 A1 Feb. 9, 2023

(30) Foreign Application Priority Data

Aug. 4, 2021 (KR) .................. 10-2021-0102330

(51) Int. Cl.
| | |
|---|---|
| *G06F 3/044* | (2006.01) |
| *H01L 27/32* | (2006.01) |
| *H01L 51/52* | (2006.01) |
| *H10K 50/86* | (2023.01) |
| *H10K 50/80* | (2023.01) |
| *H10K 59/40* | (2023.01) |

(52) U.S. Cl.
CPC ......... *G06F 3/0446* (2019.05); *H10K 50/865* (2023.02); *H10K 50/868* (2023.02); *H10K 59/40* (2023.02); *G06F 2203/04107* (2013.01); *G06F 2203/04111* (2013.01); *G06F 2203/04112* (2013.01)

(58) Field of Classification Search
CPC ......... G06F 3/0446; G06F 2203/04107; G06F 2203/04111; G06F 2203/04112; H01L 27/323; H01L 51/5284; H01L 51/5293
See application file for complete search history.

(56) References Cited

U.S. PATENT DOCUMENTS

| | | | |
|---|---|---|---|
| 10,886,353 B2 | 1/2021 | Lee | |
| 11,099,417 B2 | 8/2021 | Lee et al. | |
| 2016/0109998 A1 | 4/2016 | Watanabe | |
| 2020/0089356 A1* | 3/2020 | Qi | G06F 3/0443 |

(Continued)

FOREIGN PATENT DOCUMENTS

| | | |
|---|---|---|
| KR | 10-2016-0044414 | 4/2016 |
| KR | 10-2017-0059264 | 5/2017 |

(Continued)

*Primary Examiner* — Deeprose Subedi
(74) *Attorney, Agent, or Firm* — F. Chau & Associates, LLC

(57) ABSTRACT

An electronic device includes a base layer, a first sensing pattern disposed on the base layer and including a plurality of first mesh lines, a second sensing pattern disposed on the base layer, spaced apart from the first sensing pattern, and including a plurality of second mesh lines, and a light shielding pattern disposed on the plurality of first mesh lines and the plurality of second mesh lines, and including a plurality of light shielding mesh lines. The minimum thickness of the plurality of light shielding mesh lines is greater than the thickness of the first mesh lines and the thickness of the second mesh lines.

22 Claims, 13 Drawing Sheets

(56) References Cited

U.S. PATENT DOCUMENTS

2020/0097122 A1 3/2020 Gwon et al.
2021/0200363 A1* 7/2021 Lee ...................... H01L 27/323

FOREIGN PATENT DOCUMENTS

| KR | 10-1957491 | 3/2019 |
|----|------------|--------|
| KR | 10-2037851 | 10/2019 |
| KR | 10-2020-0017622 | 2/2020 |
| KR | 10-2020-0103220 | 9/2020 |
| KR | 10-2195966 | 12/2020 |

* cited by examiner

ELECTRONIC DEVICE COMPRISING SENSING PATTERN

CROSS-REFERENCE TO RELATED APPLICATIONS

This application claims priority under 35 U.S.C. § 119 to Korean Patent Application No. 10-2021-0102330, filed on Aug. 4, 2021 in the Korean Intellectual Property Office, the disclosure of which is incorporated by reference herein in its entirety.

TECHNICAL FIELD

Embodiments of the present disclosure relate to an electronic device, and more particularly, an electronic device in which visibility of an internal configuration is reduced or prevented by external light reflection.

DISCUSSION OF RELATED ART

An electronic device is activated by receiving an electrical signal. The electronic device includes a display device, which displays an image, and/or a touch screen which senses an externally applied touch. The electronic device may include various conductive patterns that are activated by the electrical signal. An area having the activated conductive patterns displays information and/or reacts to the external input, such as a touch, applied from outside of the electronic device. The conductive patterns may include signal lines disposed in a peripheral area. The signal lines have a higher reflectance with respect to incident external light.

SUMMARY

Embodiments of the present disclosure provide an electronic device capable of preventing the boundary between sensing patterns from being viewed from outside of the electronic device (e.g., from being viewed by a user).

According to an embodiment, an electronic device includes a base layer, a first sensing pattern disposed on the base layer and including a plurality of first mesh lines, a second sensing pattern disposed on the base layer, spaced apart from the first sensing pattern, and including a plurality of second mesh lines, and a light shielding pattern disposed on the plurality of first mesh lines and the plurality of second mesh lines, and including a plurality of light shielding mesh lines. The minimum thickness of the plurality of light shielding mesh lines is greater than the thickness of the first mesh lines and the thickness of the second mesh lines.

In an embodiment, the plurality of first mesh lines includes a first line extending in a first crossing direction and a first crossing line, which extends in a second crossing direction crossing the first crossing direction, the plurality of second mesh lines includes a second line, which extends in the first crossing direction and is spaced apart from the first line in the first crossing direction, and a second crossing line extending in the second crossing direction. The plurality of light shielding mesh lines includes a light shielding line, which extends in the first crossing direction, and a crossing light shielding line extending in the second crossing direction. The light shielding line overlaps the first line, the second line, and a gap between the first line and the second line.

In an embodiment, the width of each of the plurality of light shielding mesh lines is about equal to or greater than the width of each of the plurality of first mesh lines.

In an embodiment, each of the plurality of first mesh lines includes a top surface and side surfaces connected to the top surface. The top surface directly contacts one light shielding mesh line of the plurality of light shielding mesh lines.

In an embodiment, the side surfaces are not covered by the one light shielding line.

In an embodiment, the top surface and the side surfaces connected to the top surface are covered by the one light shielding mesh line.

In an embodiment, the electronic device further includes an organic layer disposed between the first sensing pattern and the base layer, and between the second sensing pattern and the base layer, and a bridge pattern disposed between the base layer and the organic layer and electrically connected to the second sensing pattern.

In an embodiment, the thickness of the organic layer is equal to or greater than about 0.5 micrometers and is equal to or less than about 4 micrometers.

In an embodiment, the first sensing pattern includes a plurality of first openings and a second opening having the size greater than the size of each of the plurality of first openings, and the second opening overlaps a portion of the bridge pattern.

In an embodiment, the electronic device further includes a polarizing film disposed on the light shielding pattern, and an adhesive layer disposed between the light shielding pattern and a polarizing film. The adhesive layer includes a bottom surface, which is uneven, and a top surface which is even. The light shielding pattern directly contacts the bottom surface of the adhesive layer, and the polarizing film directly contacts the top surface of the adhesive layer.

In an embodiment, the electronic device further includes a planarization layer that covers the light shielding pattern and comprises a flat top surface, an adhesive layer disposed on the planarization layer and attached to the top surface of the planarization layer, and a polarizing film disposed on the adhesive layer.

In an embodiment, the electronic device includes a display layer disposed under the base layer and including a display area that displays an image and a non-display area adjacent to the display area. The first sensing pattern, the second sensing pattern, and the light shielding pattern overlap the display area.

In an embodiment, the electronic device further includes a first trace line disposed on the base layer and connected to the first sensing pattern and a second trace line disposed on the base layer and connected to the second sensing pattern. The light shielding pattern further includes a first light shielding line and a second light shielding line overlapping the first trace line and the second trace line, respectively.

In an embodiment, the first trace line, the second trace line, the first light shielding line, and the second light shielding line overlap the non-display area.

In an embodiment, a portion of the first trace line, a portion of the second trace line, a portion of the first light shielding line, and a portion of the second light shielding line overlap the display area.

In an embodiment, the electronic device further includes a dummy line overlapping the display area and disposed between the first trace line and the second trace line. The light shielding pattern further includes a light shielding dummy line overlapping the dummy line.

In an embodiment, the minimum thickness of the plurality of light shielding mesh lines is in the range of about 0.5 micrometer to about 4 micrometers. Each of the thickness of the first mesh lines and the thickness of the second mesh lines is in the range of about 0.2 micrometer to about 0.4 micrometers.

In an embodiment, the plurality of first mesh lines constituting the first sensing pattern are continuously linked to each other, and the plurality of second mesh lines constituting the second sensing pattern are continuously linked to each other.

According to an embodiment of the present disclosure, an electronic device includes a display layer which includes a first base layer, a circuit layer disposed on the first base layer, a light emitting device layer disposed on the circuit layer, and encapsulating layer disposed on the light emitting device layer, a sensor layer including a second base layer directly disposed on the encapsulating layer, a plurality of sensing patterns disposed on the second base layer, and a light shielding pattern overlapping the plurality of sensing patterns, and a polarizing film disposed on the sensor layer. The light shielding pattern directly contacts top surfaces of the plurality of sensing patterns, and the minimum thickness of the light shielding pattern is greater than the thickness of each of the plurality of sensing patterns.

In an embodiment, in the electronic device, the sensor layer further includes a plurality of trace lines connected to the plurality of sensing patterns and a plurality of light shielding lines overlapping the plurality of trace lines.

In an embodiment, the electronic device further includes a planarization layer interposed between the sensor layer and the polarizing film, and includes a bottom surface, which is uneven, and a top surface which is even.

In an embodiment, the sensor layer further includes an organic layer disposed between the second base layer and a plurality of sensing patterns, and a bridge pattern disposed between the second base layer and the organic layer, and electrically connected to at least one sensing pattern of the plurality of sensing patterns. The thickness of the organic layer is equal to or greater than about 0.5 micrometers and equal to or less than about 4 micrometers.

BRIEF DESCRIPTION OF THE DRAWINGS

The above and other objects and features of the present disclosure will become apparent by describing in detail embodiments thereof with reference to the accompanying drawings, in which.

DETAILED DESCRIPTION

Figure 1:
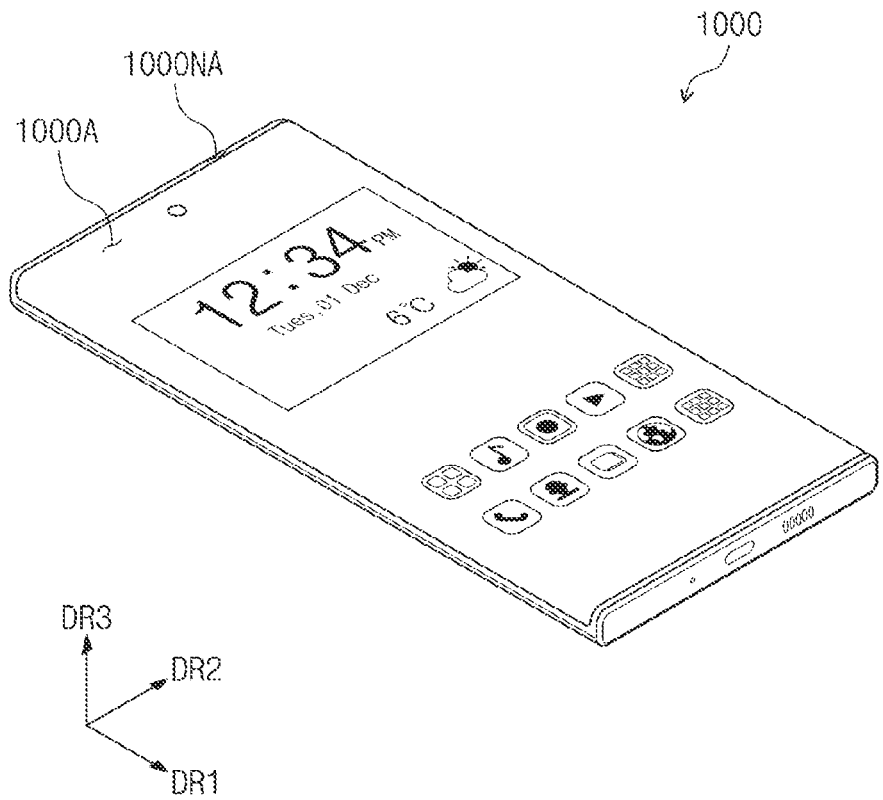
FIG. 1 is a perspective view of an electronic device, according to an embodiment of the present disclosure.

Embodiments of the present disclosure will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or" includes one or more combinations of the associated listed items.

Although the terms "first", "second", etc. may be used to describe various components, the components should not be construed as being limited by these terms. The terms are only used to distinguish one component from another component. For example, without departing from the scope and spirit of the present disclosure, a first component may be referred to as a second component, and similarly, the second component may be referred to as the first component.

Herein, singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a perspective view illustrating an electronic device 1000, according to an embodiment of the present disclosure.

Referring to FIG. 1, the electronic device 1000 may be activated in response to an electrical signal. For example, the electronic device 1000 may be a cellular phone, a tablet, a car navigation system, a game console, or a wearable device. However, the electronic device 1000 is not limited thereto. FIG. 1 illustrates that the electronic device 1000 is a cellular phone.

The electronic device 1000 may include a display area 1000A and a non-display area 1000NA defined in the electronic device 1000. The non-display area 1000NA may be a peripheral area of the display area 1000A. The electronic device 1000 may display an image through the display area 1000A.

The thickness direction of the electronic device 1000 may be parallel to a third direction DR3 crossing a first direction DR1 and a second direction DR2. Accordingly, front surfaces (or top surfaces) and rear surfaces (or bottom surfaces) of members constituting the electronic device 1000 may be defined based on the third direction DR3. The wording "viewed on a plane" may indicate "viewed in the third direction DR3 of the electronic device 1000".

Figure 2:
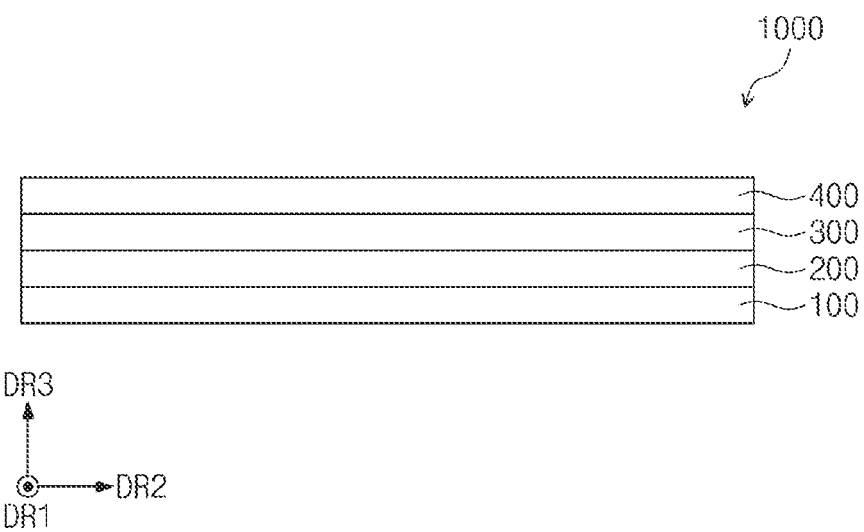
FIG. 2 is a schematic cross-sectional view of an electronic device, according to an embodiment of the present disclosure.

FIG. 2 is a schematic cross-sectional view of the electronic device 1000, according to an embodiment of the present disclosure.

Referring to FIG. 2, the electronic device 1000 may include a display layer 100, a sensor layer 200, an optical film 300, and a window 400. According to an embodiment of the present disclosure, some of the above components may be omitted, and another component(s) may be additionally added. An adhesive layer may be interposed between these components. The adhesive layer may include, for example, an optically clear adhesive (OCA) film, or a pressure sensitive adhesive (PSA) film. Adhesive layers to be described below may include the above material or a typical adhesive agent.

The display layer 100 may be a component which generates an image. The display layer 100 may be a light emitting display layer. For example, the display layer 100 may be an organic light emitting display layer, an inorganic light emitting display layer, an organic-inorganic display layer, a quantum dot display layer, a micro-LED display layer, or a nano-LED display layer.

The sensor layer 200 may be disposed on the display layer 100. The sensor layer 200 may sense an external input applied to the sensor layer 200 from outside of the electronic device 1000. The external input may be a user input. The user input may include various types of external inputs such as, for example, an input from a part of a user's body (e.g., a user's finger) or a pen, light, heat, or pressure.

The sensor layer 200 may be formed on the display layer 100 through a successive process. In this case, the sensor layer 200 may be expressed as being directly disposed on the display layer 100. The phrase "directly disposed" may indicate that an intervening component is not disposed between the sensor layer 200 and the display layer 100. In other words, according to embodiments, an adhesive member is not interposed between the sensor layer 200 and the display layer 100 when the sensor layer 200 is directly disposed on the display layer 100. Alternatively, according to embodiments, the sensor layer 200 may be bonded to the display layer 100 through an adhesive member. The adhesive member may include a typical adhesive or a sticking agent.

The optical film 300 may reduce a reflectance of light incident from the outside. The optical film 300 may include, for example, a retarder and a polarizer. The optical film 300 may be referred to as a polarizing film. The optical film 300 may be attached to the sensor layer 200 through an adhesive layer.

The window 400 may be disposed on the optical film 300. The window 400 may include an optically transparent material. For example, the window 400 may include glass or plastic. The window 400 may have a multi-layer structure or a single layer structure. For example, the window 400 may include a plurality of plastic films bonded to each other by an adhesive, or may have a glass substrate and a plastic film bonded to each other by an adhesive.

Figure 3:
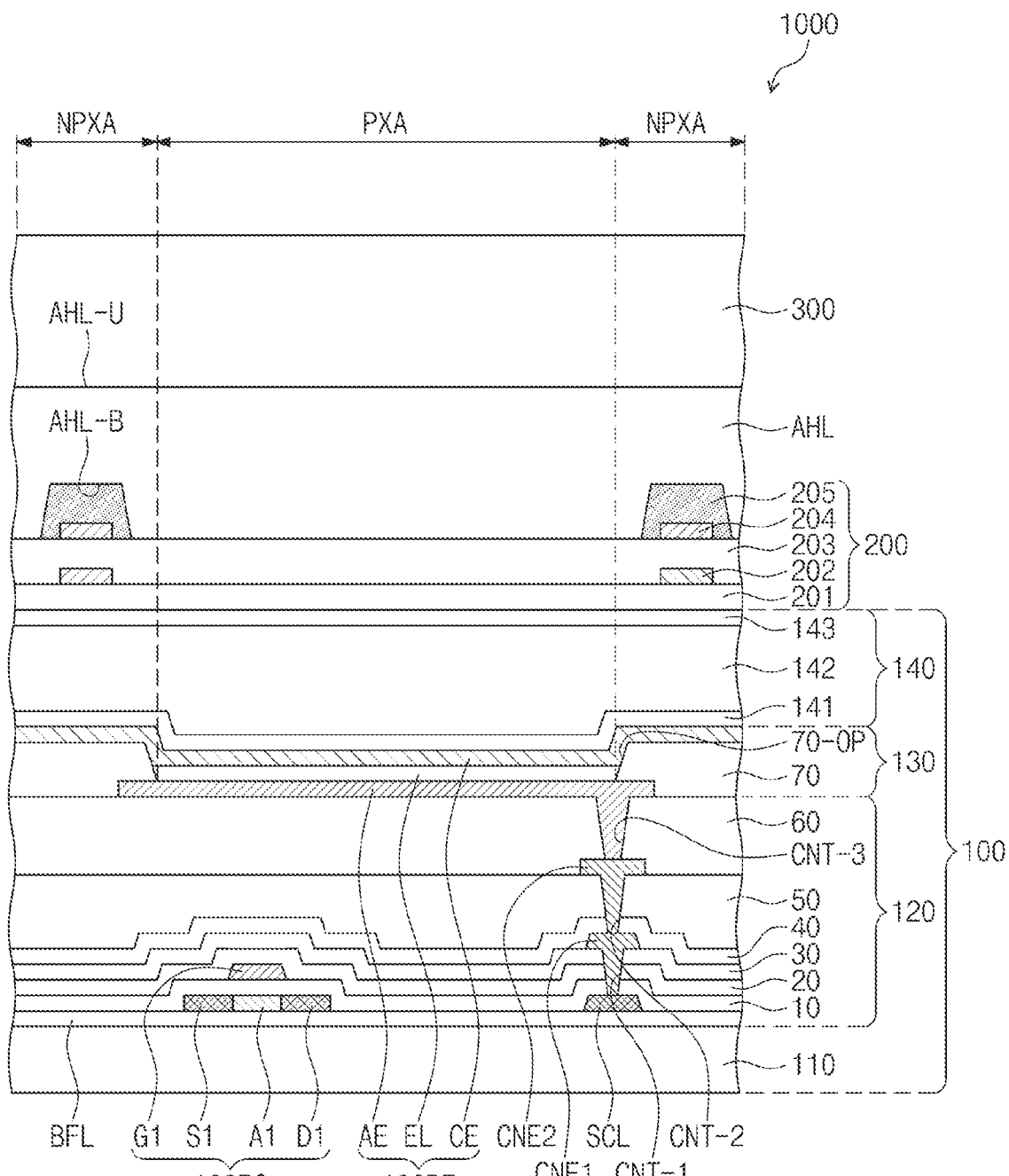
FIG. 3 is a schematic cross-sectional view of some components of the electronic device, according to an embodiment of the present disclosure.

FIG. 3 is a schematic cross-sectional view of some components of the electronic device 1000, according to an embodiment of the present disclosure.

FIG. 3 illustrates the display layer 100, the sensor layer 200, and the optical film 300 among components of the electronic device 1000.

The display layer 100 may include a base layer 110, a circuit layer 120, a light emitting device layer 130, and an encapsulating layer 140.

The base layer 110 may be a member that provides a base surface for disposing the circuit layer 120. The base layer 110 may be, for example, a rigid substrate, or a flexible substrate allowing bending, folding, or rolling. The base layer 110 may be, for example, a glass substrate, a metal substrate, or a polymer substrate, etc. However, embodiment of the present disclosure are not limited thereto. For example, according to embodiments, the base layer 110 may be an inorganic layer, an organic layer, or a composite material layer.

The base layer 110 may have a multi-layer structure. For example, the base layer 110 may include a first synthetic resin layer, an intermediate layer in a multi-layer structure or a single layer structure, and a second synthetic resin layer disposed on intermediate layer. The intermediate layer may be referred to as a base barrier layer. The intermediate layer may include, for example, a silicon oxide ($SiO_x$) layer and an amorphous silicon (a-Si) layer disposed on the silicon oxide layer. For example, the intermediate layer may include at least one of a silicon oxide layer, a silicon nitride layer, a silicon oxynitride layer, or an amorphous silicon layer.

Each of the first and second synthetic resin layers may include polyimide-based resin. Also, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. The phrase "~-based resin" in the specification indicates that "~~-based resin" includes the functional group of "~~".

The circuit layer 120 may be disposed on the base layer 110. The circuit layer 120 may include, for example, an insulating layer, a semiconductor pattern, a conductive pattern, and a signal line. An insulating layer, a semiconductor layer, and a conductive layer may be formed on the base layer 110 through a coating or deposition process, and the insulating layer, the semiconductor layer, and the conductive layer may then be selectively patterned through a plurality of photolithography processes. Thereafter, the semiconductor pattern, the conductive pattern, and the signal line included in the circuit layer 120 may be formed.

A buffer layer BFL may be disposed on the base layer 110. The buffer layer BFL may prevent metal atoms or impurities from being spread into a semiconductor pattern from the base layer 110. In addition, the buffer layer BFL may adjust the speed of applying heat during a crystallization process for forming the semiconductor pattern, such that the semiconductor pattern is uniformly formed.

The semiconductor pattern may be disposed on the buffer layer BFL. The semiconductor pattern may include a silicon semiconductor. For example, the silicon semiconductor may include amorphous silicon or polycrystalline silicon. For example, the semiconductor pattern may include low-temperature polysilicon. However, embodiments of the present disclosure are not limited thereto. For example, according to embodiments, the semiconductor pattern may include an oxide semiconductor.

FIG. 3 illustrates only a portion of the semiconductor pattern disposed on the buffer layer BFL, and another portion of the semiconductor pattern may be additionally disposed in another area. Semiconductor patterns may be arranged in a specific rule, across pixels. The semiconductor pattern may have a different electrical property depending on whether the semiconductor pattern is doped. The semiconductor pattern may include a first area having higher conductivity and a second area having lower conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped at a concentration lower than the concentration of the first area.

In an embodiment, the conductivity of the first area is higher than the conductivity of the second area. The first area may substantially serve as an electrode or a signal line. The second area may substantially correspond to an active area (or channel) of a transistor. In other words, a portion of the semiconductor pattern may be an active area of a transistor, another portion of the semiconductor pattern may be a source area or a drain area of the transistor, and another portion of the semiconductor pattern may be a connection electrode or a connection signal line.

Each of a plurality of pixels may have an equivalent circuit including seven transistors, one capacitor, and a light emitting device, and the equivalent circuit of the pixel may be modified in various forms. One transistor 100PC and one light emitting device 100PE included in the pixel are illustrated in FIG. 3 by way of example.

A source area S1, an active area A1, and a drain area D1 of the transistor 100PC may be formed from the semiconductor pattern. The source area S1 and the drain area D1 may extend in directions opposite to each other from the active area A1, when viewed in a cross-sectional view. A portion of a connection signal line SCL formed from the semiconductor pattern is illustrated in FIG. 3. In an embodiment, the connection signal line SCL may be connected to the drain area D1 of the transistor 100PC, when viewed in a plan view.

A first insulating layer 10 may be disposed on the buffer layer BFL. The first insulating layer 10 may overlap a plurality of pixels in common and may cover the semiconductor pattern. The first insulating layer 10 may be, for example, an inorganic layer and/or an organic layer, and may have a single layer structure or a multi-layer structure. The first insulating layer 10 may include at least one of, for example, an aluminum oxide, a titanium oxide, a silicon oxide, a silicon nitride, a silicon oxynitride, a zirconium oxide, or a hafnium oxide. According to an embodiment, the first insulating layer 10 may be a silicon oxide layer having a single layer structure. The first insulating layer 10 and an insulating layer of the circuit layer 120, which is to be described later, may be an inorganic layer and/or an organic layer, and may have a single layer structure or a multi-layer structure. The inorganic layer may include, but is not limited to, at least one of the above-described materials.

A gate G1 of a transistor 100PC is disposed on the first insulating layer 10. The gate G1 may be a portion of a metal pattern. The gate G1 overlaps the active area A1. The gate G1 may function as a mask in a process of doping the semiconductor pattern.

A second insulating layer 20 may be disposed on the first insulating layer 10 and may cover the gate G1. The second insulating layer 20 may overlap the pixels in common. The second insulating layer 20 may be, for example, an inorganic layer and/or an organic layer, and may have a single layer structure or a multi-layer structure. According to an embodiment, the second insulating layer 20 may be, for example, a silicon oxide layer or a silicon nitride layer having in a single layer structure.

A third insulating layer 30 may be disposed on the second insulating layer 20. According to an embodiment, the third insulating layer 30 may be, for example, a silicon oxide layer or a silicon nitride layer having a single layer structure.

A first connection electrode CNE1 may be disposed on the third insulating layer 30. The first connection electrode CNE1 may be connected to the connection signal line SCL through a contact hole CNT-1 formed through the first insulating layer 10, the second insulating layer 20, and the third insulating layer 30.

A fourth insulating layer 40 may be disposed on the third insulating layer 30. The fourth insulating layer 40 may be a silicon oxide layer having a single layer structure. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 formed through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting device layer 130 may be disposed on the circuit layer 120. The light emitting device layer 130 may include the light emitting device 100PE. For example, the light emitting device layer 130 may include an organic light emitting material, an inorganic light emitting material, an organic-inorganic light emitting material, a quantum dot, a quantum rod, a micro-LED, or a nano-LED.

The light emitting device layer 130 including the light emitting device 100PE may be disposed on the circuit layer 120. The light emitting device 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 formed through the sixth insulating layer 60.

A pixel defining layer 70 may be disposed on the sixth insulating layer 60 and may cover a portion of the first electrode AE. An opening 70-OP is defined in the pixel defining layer 70. The opening 70-OP of the pixel defining layer 70 exposes at least a portion of the first electrode AE.

As illustrated in FIG. 3, a display area 100A (see FIG. 4) may include a light emitting area PXA and a non-light emitting area NPXA adjacent to the light emitting area PXA. The non-light emitting area NPXA may surround the light emitting area PXA. In an embodiment, the light emitting area PXA is defined to correspond to the portion of the first electrode AE, which is exposed by the opening 70-OP.

The light emitting layer EL may be disposed on the first electrode AE. The light emitting layer EL may be disposed in an area defined by the opening 70-OP. In other words, the light emitting layer EL may be separately formed for each of the pixels. When the light emitting layer EL is separately formed for each pixel, each of the light emitting layers EL may emit light of at least one of a blue color, a red color, or a green color. However, embodiments of the present disclosure are not limited thereto, and the light emitting layer EL may be provided in common to the plurality of pixels according to embodiments. In this case, the light emitting layer EL may provide blue light or white light.

The second electrode CE may be disposed on the light emitting layer EL. The second electrode CE may be integrally disposed in a plurality of pixels in common.

In an embodiment, a hole control layer may be interposed between the first electrode AE and the light emitting layer EL. The hole control layer may be disposed, in common, in the light emitting area PXA and the non-light emitting area NPXA. The hole control layer may include a hole transport layer and may further include a hole injection layer. An electron control layer may be interposed between the light emitting layer EL and the second electrode CE. The electron control layer may include an electron transport layer and may further include an electron injection layer. The hole control layer and the electron control layer may be formed, in common, in a plurality of pixels by using an open mask.

The encapsulating layer 140 may be disposed on the light emitting device layer 130. The encapsulating layer 140 may include an inorganic layer 141, an organic layer 142, and an inorganic layer 143 sequentially stacked on each other. However, layers constituting the encapsulating layer 140 are not limited thereto.

The inorganic layer 141 and the inorganic layer 143 may protect the light emitting device layer 130 from, for example, moisture and oxygen, and the organic layer 142 may protect the light emitting device layer 130 from a foreign material such as, for example, dust particles. The inorganic layer 141 and the inorganic layer 143 may include, for example, a silicon nitride layer, a silicon oxynitride layer, a silicon oxide layer, a titanium oxide layer, or an aluminum oxide layer. The organic layer 142 may include, but is not limited to, an acryl-based organic layer. The thickness of the organic layer 142 may be in the range of about 4 micrometers to about 12 micrometers.

The sensor layer 200 may include a base layer 201, a first conductive layer 202, a sensing insulating layer 203, a second conductive layer 204, and a light shielding pattern 205.

The base layer 201 may be an inorganic layer including at least one of, for example, silicon nitride, silicon oxynitride, and silicon oxide. Alternatively, the base layer 201 may be an organic layer including, for example, an epoxy resin, an acrylate resin, or an imide-based resin. The base layer 201 may have a single layer structure or may have a multi-layer structure stacked in the third direction DR3.

Each of the first conductive layer 202 and the second conductive layer 204 may have a single layer structure or a multi-layer structure stacked in the third direction DR3.

A conductive layer of the single layer structure may include a metal layer or a transparent conductive layer. The metal layer may include, for example, molybdenum, silver, titanium, copper, aluminum, or the alloy thereof. The transparent conductive layer may include transparent conductive oxide such as, for example, indium tin oxide (ITO), indium zinc oxide (IZO), zinc oxide (ZnO), or indium zinc tin oxide (IZTO). In addition, the transparent conductive layer may include conductive polymer such as, for example, PEDOT, a metal nano-wire, graphene, etc.

A conductive layer in the multi-layer structure may include metal layers. The metal layers may have a three-layer structure of titanium/aluminum/titanium. The conductive layer in the multi-layer structure may include at least one metal layer and at least one transparent conductive layer.

The sensor layer 200 may acquire information on an external input through the change in mutual capacitance or self-capacitance. For example, the sensor layer 200 may include sensing patterns and bridge patterns. At least some of the sensing patterns and the bridge patterns may be included in the first conductive layer 202, and at least others of the sensing patterns and the bridge patterns may be included in the second conductive layer 204. According to an embodiment, at least one of the first conductive layer 202 or the second conductive layer 204 of the sensor layer 200 may be omitted. In this case, all of the sensing patterns may be included in one conductive layer.

The sensing insulating layer 203 may include an organic film. The organic film may include at least one of, for example, acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, or perylene-based resin. The sensing insulating layer 203 may also be referred to as an organic layer.

The light shielding pattern 205 may be disposed on the second conductive layer 204. The light shielding pattern 205 may be provided to prevent patterns, which are included in the first conductive layer 202 or the second conductive layer 204, or the boundary between the patterns, from being viewed from outside of the electronic device 1000 (e.g., from being viewed by a user of the electronic device 1000).

The light shielding pattern 205 may have a black color. The light shielding pattern 205 may include a black coloring agent. The black coloring agent may include a black dye. The black coloring agent may include a metal, such as carbon black or chromium, or an oxide thereof.

In the process of using the electronic device 1000, external light may be incident on the electronic device 1000 from outside of the electronic device 1000. As the external light is incident on components disposed in the electronic device 1000, an optical effect, such as, for example, reflection/transmission, may occur.

The external light may show different reflection aspects when the external light is incident on the patterns and when the external light is incident on a portion having no pattern. For example, according to a comparative example in which the light shielding pattern 205 is absent, when the external light is incident on the second conductive layer 204, most of the external light is reflected such that the components may be viewed, by a user, as being brighter. In contrast, when the external light is incident on an empty space in which the second conductive layer 204 is absent, the reflectance of the external light may be reduced, such that the components are viewed, by the user, as being darker. According to an embodiment of the present disclosure, the second conductive layer 204 may be covered by the light shielding pattern 205. Therefore, when the external light is incident toward the second conductive layer 204, the external light may be absorbed by the light shielding pattern 205. Accordingly, the difference in the reflectance may be reduced between the area in which the second conductive layer 204 is disposed and the area in which the second conductive layer 204 is not disposed. Accordingly, the patterns included in the second conductive layer 204 may be prevented from being viewed due to external light reflection.

The optical film 300 may be disposed on the sensor layer 200. The optical film 300 may reduce the reflectance of the external light which is incident on the electronic device 1000 from the outside. The optical film 300 may be bonded to the sensor layer 200 through an adhesive layer AHL. The optical film 300 may be a polarizing film.

The adhesive layer AHL may include a bottom surface AHL-B, which is uneven, and a top surface AHL-U which is even. The bottom surface AHL-B of the adhesive layer AHL may have an uneven shape corresponding to the shape of the sensor layer 200. The optical film 300 may directly contact the top surface AHL-U of the adhesive layer AHL.

According to an embodiment of the present disclosure, the light shielding pattern 205 may be provided to the electronic device 1000 employing the optical film 300, for example, the polarizing film. Accordingly, the adhesive layer AHL may directly contact the light shielding pattern 205. For example, a portion of the bottom surface AHL-B of the adhesive layer AHL may directly contact the light shielding pattern 205, and another portion of the bottom surface AHL-B of the adhesive layer AHL may directly contact the sensing insulating layer 203.

According to an embodiment of the present disclosure, the electronic device 1000 may include both the optical film 300 and the light shielding pattern 205. Accordingly, the reflectance of light, which is incident on the electronic device 1000 from the outside, may be reduced due to the optical film 300 and the light shielding pattern 205. Accordingly, the black visibility of the electronic device 1000 may be increased. The black visibility refers to an extent that the electronic device 1000 expresses black when powered off.

Figure 4:
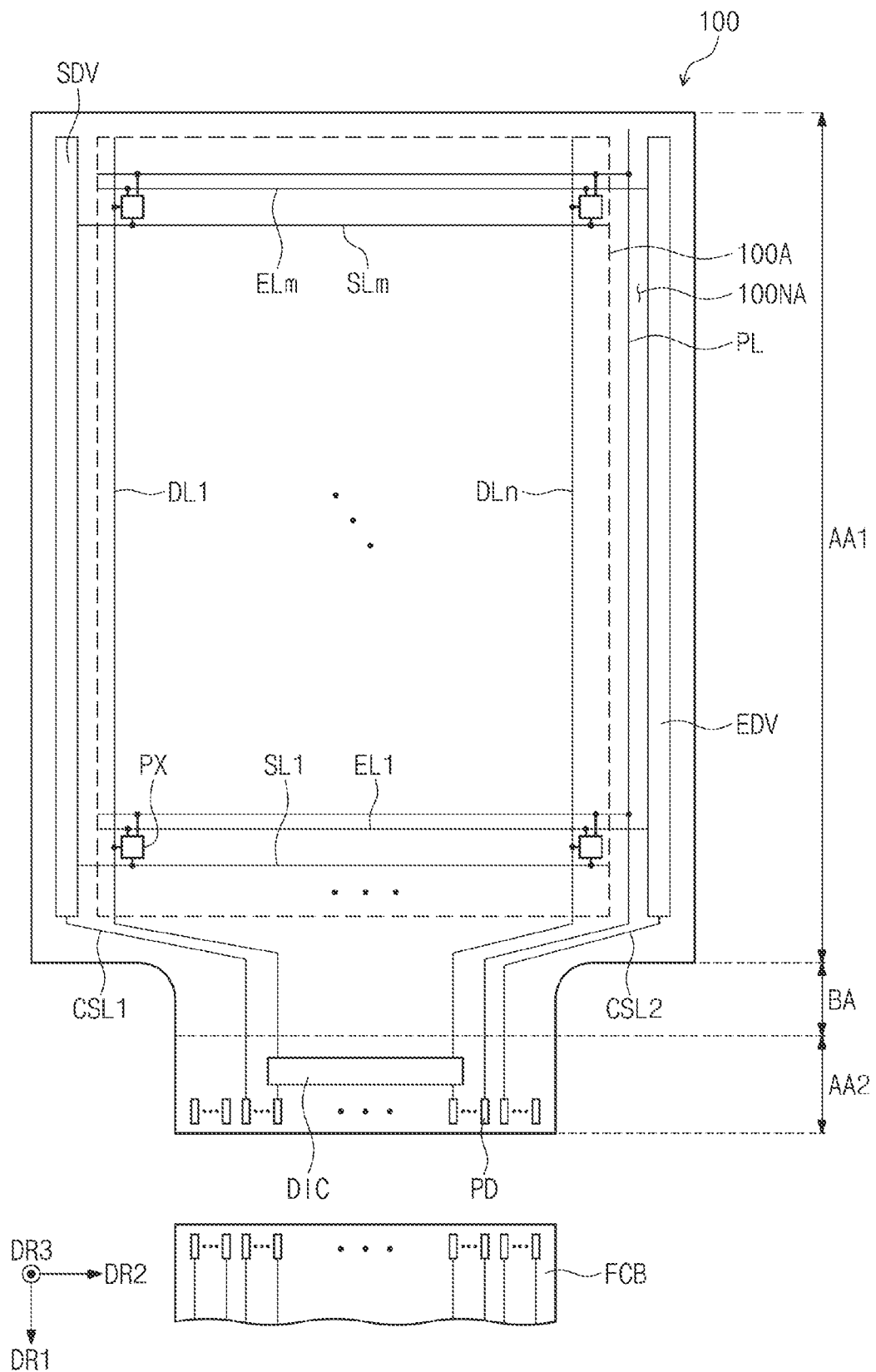
FIG. 4 is a plan view of a display layer, according to an embodiment of the present disclosure.

FIG. 4 is a plan view of the display layer 100, according to an embodiment of the present disclosure.

Referring to FIG. 4, the display layer 100 may include the display area 100A and the non-display area 100NA provided at a peripheral portion of the display area 100A. The display area 100A and the non-display area 100NA may be distinguished depending on whether the plurality of pixels PX is present. For example, the pixels PX may be disposed in the display area 100A, and are not disposed in the non-display area 100NA. A scan driver SDV, a data driver, and a light emitting driver EDV may be disposed in the non-display area 100NA. The data driver may be a portion of a circuit included in a driving chip DIC.

The display layer 100 may include a first panel area AA1, a bending area BA, and a second panel area AA2 defined in the first direction DR1. The second panel area AA2 and a bending area BA may be partial areas of the non-display area 100NA. The bending area BA is interposed between the first panel area AA1 and the second panel area AA2.

The width (or length) of the bending area BA and the width (or length) of the second panel area AA2, which are parallel to the second direction DR2, may be less than the width (or length) of the first panel area AA1 parallel to the second direction DR2. An area having a shorter length in a bending axis direction may be more easily bent.

The display layer 100 may include the plurality of pixels PX, a plurality of scan lines SL1-SLm, a plurality of data lines DL1-DLn, a plurality of light emitting lines EL1-ELm, first and second control lines CSL1 and CSL2, a power line PL, and a plurality of pads PD. In this case, "m" and "n" are natural numbers. The pixels PX may be connected to the scan lines SL1 to SLm, the data lines DL1 to DLn, and the light emitting lines EL1 to ELm.

The scan lines SL1-SLm may extend in the second direction DR2 and may be electrically connected to the scan driver SDV. The data lines DL1-DLn may extend in the first direction DR1 and may be electrically connected to the driving chip DIC via the bending area BA. The light emitting lines EL1-SLm may extend in the second direction DR2 and may be electrically connected to the light emitting driver EDV.

The power line PL may include a portion extending in the first direction DR1 and a portion extending in the second direction DR2. The portion extending in the first direction DR1 and the portion extending in the second direction DR2 may be disposed in mutually different layers. The portion, which extends in the first direction DR1, of the power line PL may extend to the second panel area AA2 via the bending area BA. The power line PL may provide the first voltage to the pixels PX.

A first control line CSL1 may be connected to the scan driver SDV and may extend toward a lower end of the second panel area AA2 via the bending area BA. A second control line CSL2 may be connected to the light emitting driver EDV and may extend toward the lower end of the second panel area AA2 via the bending area BA.

When viewed on a plane, the pads PD may be disposed to be adjacent to the lower end of the second panel area AA2. The driving chip DIC, the power line PL, the first control line CSL1, and the second control line CSL2 may be electrically connected to the pads PD. A flexible circuit film (FCB) may be electrically connected to the pads PD through an anisotropic conductive film.

Figure 5:
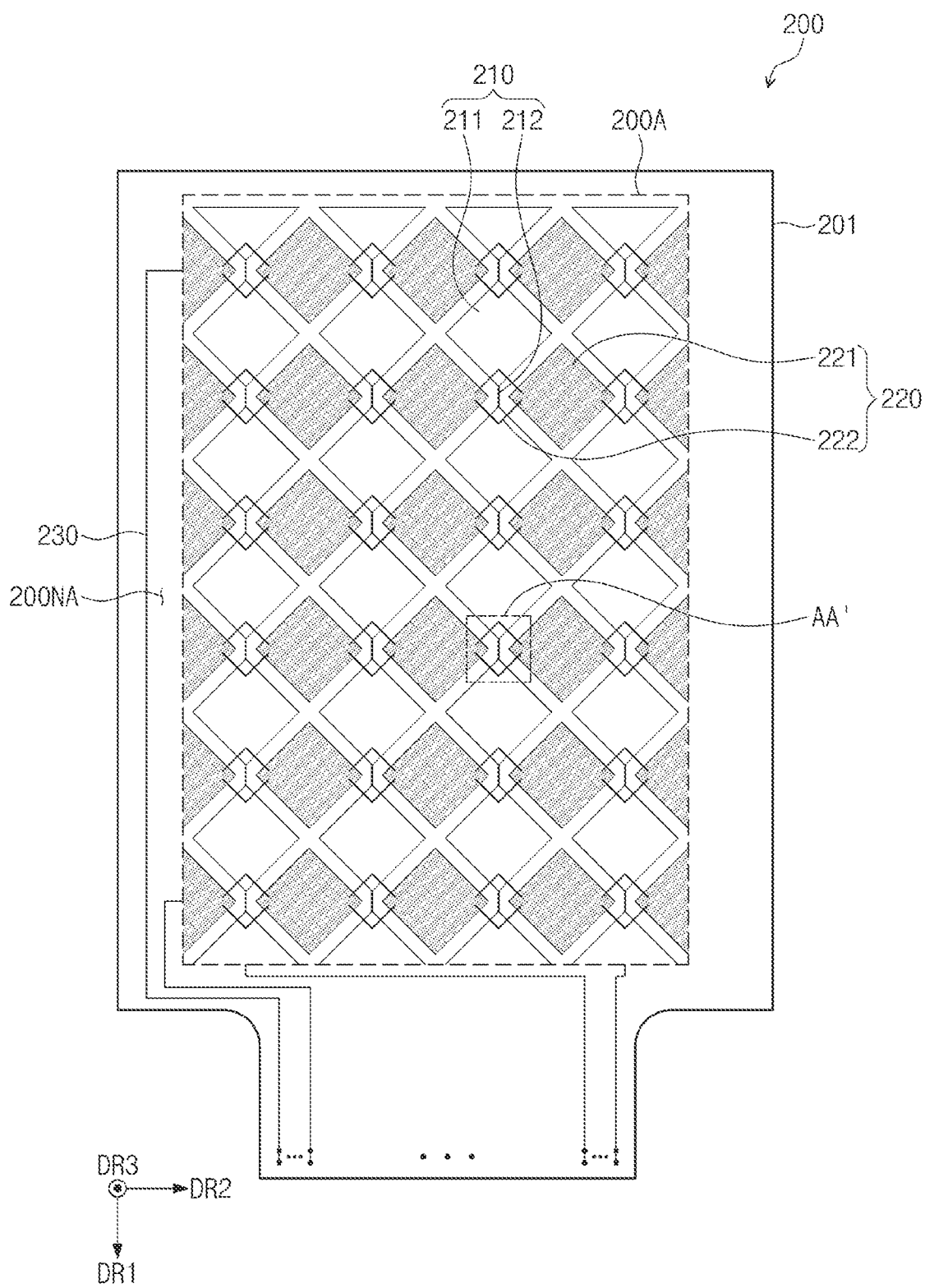
FIG. 5 is a plan view of a sensor layer, according to an embodiment of the present disclosure.

FIG. 5 is a plan view of the sensor layer 200, according to an embodiment of the present disclosure.

Referring to FIG. 5, the sensor layer 200 may include a sensing area 200A and a peripheral area 200NA which are defined in the sensor layer 200. The sensing area 200A may be an area activated in response to an electrical signal. For example, the sensing area 200A may be an area that senses an external input. The peripheral area 200NA may be adjacent to the sensing area 200A, and in embodiments, may surround the sensing area 200A.

The sensor layer 200 may include electrodes 210, cross electrodes 220, and trace lines 230. The electrodes 210 and the cross electrodes 220 may be disposed in the sensing area 200A, and the trace lines 230 may be disposed in the peripheral area 200NA. The sensor layer 200 may acquire information on an external input, based on a change in mutual capacitance between the electrodes 210 and the cross electrodes 220.

The electrodes 210 may extend in the first direction DR1, and may be arranged in the second direction DR2. Each of the electrodes 210 may include first sensing patterns 211 and a connection portion 212. The connection portion 212 may be adjacent to the two first sensing patterns 211 adjacent to each other. The first sensing patterns 211 and the connection portion 212, which constitute one electrode 210, may be integrally connected to each other. Accordingly, the first sensing patterns 211 may be referred to as pattern parts 211.

The cross electrodes 220 may extend in the second direction DR2, and may be arranged in the first direction DR1. Each of the cross electrodes 220 may include second sensing patterns 221 and bridge patterns 222. Each of the bridge patterns 222 may electrically connect adjacent two second sensing patterns 221 to each other. Although the adjacent two second sensing patterns 221 may be connected to each other by two bridge patterns 222, embodiments of the present disclosure are not limited thereto. The connection portion 212 may be insulated from the two bridge patterns 222 while crossing the two bridge patterns 222.

The first sensing patterns 211, the connection portion 212, and the second sensing patterns 221 may be disposed in the same layer, and the bridge patterns 222 may be disposed in a layer different from the layer in which the first sensing patterns 211, the connection portion 212, and the second sensing patterns 221 are disposed. For example, the first sensing patterns 211, the connection portion 212, and the second sensing patterns 221 may be included in the second conductive layer 204 (see FIG. 3), and the bridge pattern 222 may be included in the first conductive layer 202 (See FIG. 3). The above structure may be referred to as a bottom bridge structure. However, embodiments of the present disclosure are not limited thereto. For example, according to embodiments, the first sensing patterns 211, the connection portion 212, and the second sensing patterns 221 may be included in the first conductive layer 202 (see FIG. 3), and the bridge patterns 222 may be included in the second conductive layer 204 (See FIG. 3). The above structure may be referred to as a top bridge structure.

FIG. 5 illustrates the shapes of the electrodes 210 and the cross electrodes 220, and the arrangement relationship between the electrodes 210 and the cross electrodes 220. The shapes of the electrodes 210 and the cross electrodes 220 constituting the sensor layer 200, and the arrangement relationship between the electrodes 210 and the cross electrodes 220, are not limited to those illustrated in FIG. 5.

Figure 6A:
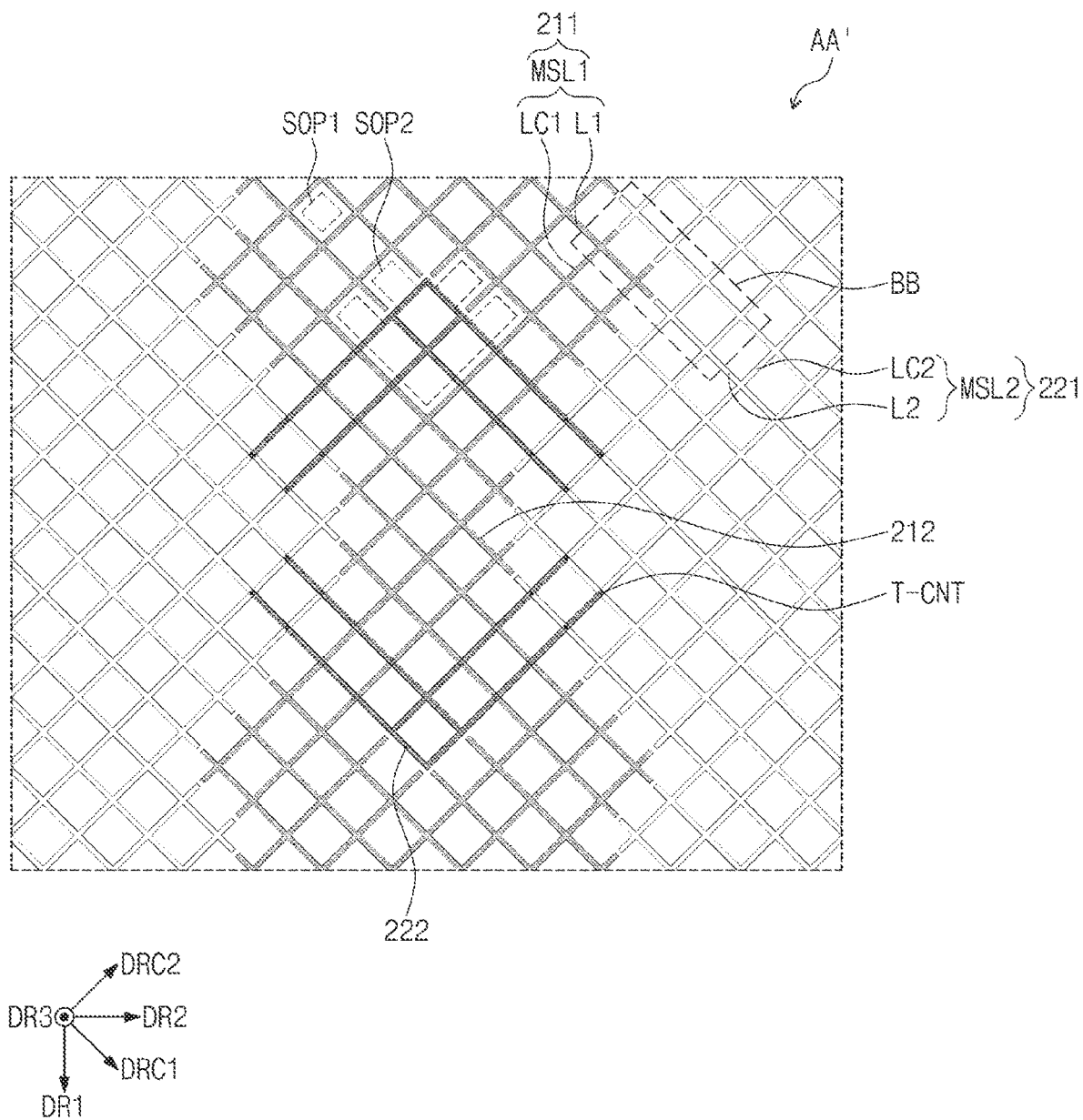
FIG. 6A is an expanded plan view of an area AA' illustrated in FIG. 5, according to an embodiment of the present disclosure.
Figure 6B:
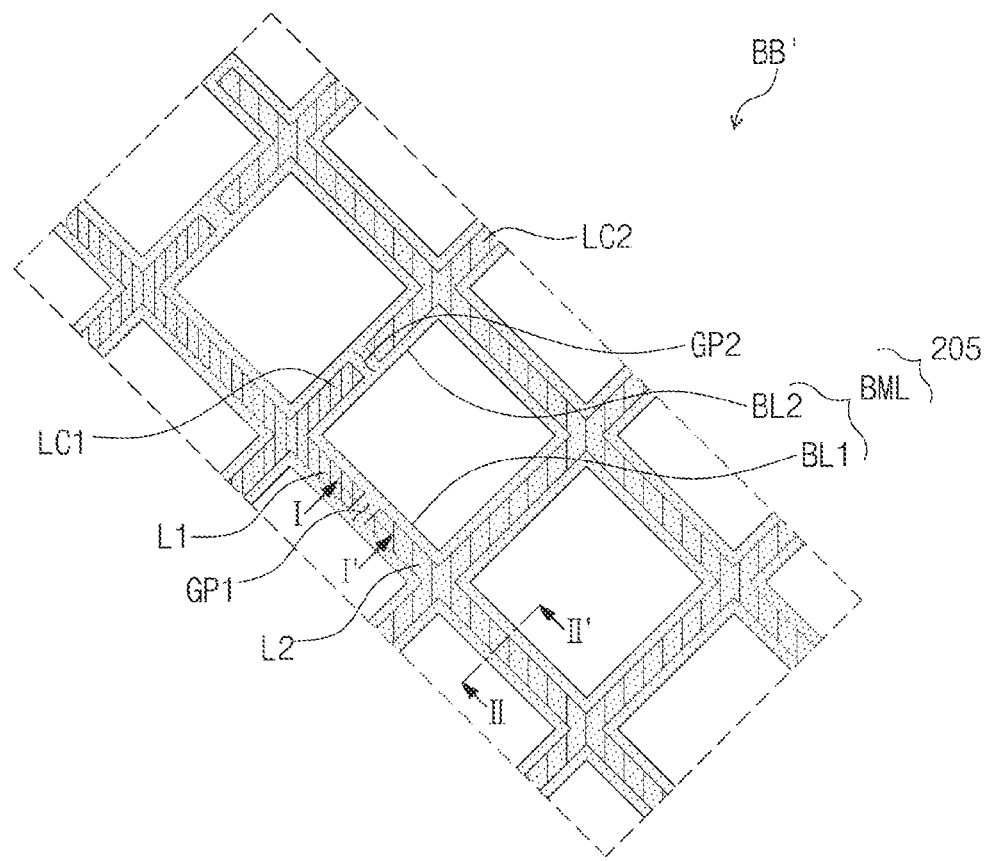
FIG. 6B is an expanded plan view of an area BB' illustrated in FIG. 6A, according to an embodiment of the present disclosure.
Figure 6B:
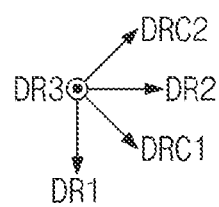

FIG. 6A is an expanded plan view of an area AA' illustrated in FIG. 5, according to an embodiment of the present disclosure. FIG. 6B is an expanded plan view of an area BB' illustrated in FIG. 6A, according to an embodiment of the present disclosure.

Referring to FIGS. 5, 6A, and 6B, each of the first sensing pattern 211 and the second sensing pattern 221 may have a mesh (or a lattice, or a net) structure. The sensor layer 200 may be directly disposed on the display layer 100 (see FIG. 3). In this case, the gap between the sensor layer 200 and the second electrode CE (see FIG. 3) of the display layer 100 (see FIG. 3) may be reduced. According to embodiments of the present disclosure, since each of the first sensing pattern 211 and the second sensing pattern 221 has a mesh structure, the base capacitance from the parasitic capacitance between the electrodes 210 and the second electrode CE (see FIG. 3), and the base capacitance from the parasitic capacitance between the cross electrodes 220 and the second electrode CE (see FIG. 3), may be further reduced as compared to that of the first sensing pattern 211 and the second sensing pattern 221 including electrode forms having no opening. Accordingly, as the first sensing pattern 211 and the second sensing pattern 221 have a mesh structure, the touch sensitivity of the sensor layer 200 may be increased according to embodiments of the present disclosure.

The first sensing pattern 211 may include first mesh lines MSL1. The first mesh lines MSL1 may include first lines L1 and first crossing lines LC1. The first lines L1 may extend in a first crossing direction DRC1 and may be spaced apart from each other in a second crossing direction DRC2. The first crossing lines LC1 may extend in a second crossing direction DRC2 and may be spaced apart from each other in the first crossing direction DRC1.

The second sensing pattern 221 may include second mesh lines MSL2. The second mesh lines MSL2 may include second lines L2 and second crossing lines LC2. The second lines L2 may extend in the first crossing direction DRC1 and may be spaced apart from each other in the second crossing direction DRC2. The second crossing lines LC2 may extend in the second crossing direction DRC2 and may be spaced apart from each other in the first crossing direction DRC1.

The bridge pattern 222 may be electrically connected to the second sensing patterns 221. The bridge pattern 222 may be disposed in a layer different from the layer in which the second sensing patterns 221 are disposed, and may be electrically connected to the second sensing patterns 221 through a contact hole T-CNT.

A first opening SOP1 and a second opening SOP2 may be defined in the first sensing pattern 211. The size of the second opening SOP2 may be greater than the size of the first opening SOP1. For example, in an embodiment, the size of a second openings SOP2 is greater than the size of each of a plurality of the first openings SOP1. The second opening SOP2 may overlap a portion of the bridge pattern 222. Accordingly, the possibility that the bridge pattern 222 and the first sensing pattern 211 disposed in mutually different layers make contact with each other may be reduced.

Referring to FIGS. 6A and 6B, the light shielding pattern 205 (see FIG. 3) may include a plurality of light shielding mesh lines BML. The light shielding mesh lines BML may overlap the first mesh lines MSL1 and the second mesh lines MSL2.

The light shielding mesh lines BML may include light shielding lines BL1 and crossing light shielding lines BL2. The light shielding lines BL1 may extend in the first crossing direction DRC1 and may be spaced apart from each other in the second crossing direction DRC2. The cross light shielding lines BL2 may extend in the second crossing direction DRC2 and may be spaced apart from each other in the first crossing direction DRC1.

One light shielding line BL1 may overlap all of the first line L1, the second line L2, and a gap GP1 between the first line L1 and the second line L2. One crossing light shielding line BL2 may overlap all of the first crossing line LC1, the second crossing line LC2, and a gap GP2 between the first crossing line LC1 and the second crossing line LC2.

According to an embodiment of the present disclosure, the light shielding mesh lines BML may cover all of the first mesh lines MSL1, the second mesh lines MSL2, and the gaps GP1 and GP2 between the first mesh lines MSL1 and the second mesh lines MSL2. In this case, according to embodiments of the present disclosure, the boundary between the first mesh lines MSL1 and the second mesh lines MSL2 is not viewable from the outside (e.g., is not viewable to a user).

Since the boundary between the first mesh lines MSL1 and the second mesh lines MSL2 is not viewable due to inclusion of the light shielding mesh lines BML, according to embodiments, a cutting part is not present in the first mesh lines MSL1 and the second mesh lines MSL2. Accordingly, the plurality of first mesh lines MSL1 constituting the first sensing pattern 211 may be continuously linked to each other, and the plurality of second mesh lines MSL2 constituting the second sensing pattern 221 may be continuously linked to each other. Accordingly, resistance of each of the electrodes 210 and the cross electrodes 220 may be reduced, thereby increasing the sensing performance of the sensor layer 200.

According to embodiments, the first mesh lines MSL1 are continuously linked to each other, and the second mesh lines MSL2 are continuously linked to each other, which indicates that each of the first sensing pattern 211 and the second sensing pattern 221 has a full mesh structure without a disconnection part.

Figure 7:
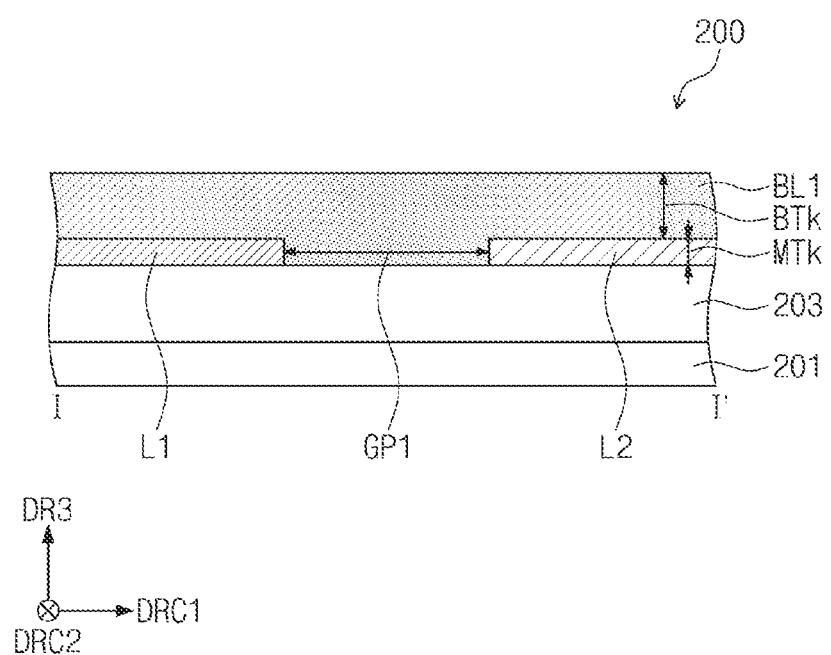
FIG. 7 is a cross-sectional view of a sensor layer taken along line I-I' of FIG. 6B, according to an embodiment of the present disclosure.

FIG. 7 is a cross-sectional view of a sensor layer taken along line I-I' of FIG. 6B, according to an embodiment of the present disclosure.

Referring to FIGS. 6A, 6B, and 7, the gap GP1 is present between the first line L1 and the second line L2, and the first line L1, the second line L2, and the gap GP1 may be covered by the light shielding line BL1.

The thickness of the light shielding mesh lines BML may be greater than the thickness of the first mesh lines MSL1 and the thickness of the second mesh lines MSL2. For example, in an embodiment, a minimum thickness of the light shielding mesh lines BML is greater than a thickness of the first mesh lines MSL1 and greater than a thickness of the second mesh lines MSL2. For example, in an embodiment, the minimum thickness of each of the light shielding mesh lines BML is greater than the thickness of each of the first mesh lines MSL1 and greater than the thickness of each of the second mesh lines MSL2 in areas where the light shielding mesh lines BML overlap the first mesh lines MSL1 and the second mesh lines MSL2. In an embodiment, the thickness at every portion of the light shielding mesh lines BML is greater than the thickness at every portion of the first mesh lines MSL1 and greater than the thickness at every portion of the second mesh lines MSL2 in areas where the light shielding mesh lines BML overlap the first mesh lines MSL1 and the second mesh lines MSL2. For example, in an embodiment, the thickness at every portion of each of the light shielding mesh lines BML is greater than the thickness at every portion of each of the first mesh lines MSL1 and greater than the thickness at every portion of each of the second mesh lines MSL2 in areas where the light shielding mesh lines BML overlap the first mesh lines MSL1 and the second mesh lines MSL2. FIG. 7 representatively illustrates a thickness BTk of the light shielding line BL1 and a thickness MTk of the second line L2. The thickness BTk of the light shielding line BL1 may be about equal to the thickness of the light shielding mesh lines BML. The thickness MTk of the second line L2 may be about equal to the thickness of the first mesh lines MSL1 and the thickness of the second mesh lines MSL2.

The thickness MTk of the second line L2 may be in the range of about 0.2 micrometers to about 0.4 micrometers, and the thickness BTk of the light shielding line BL1 may be in the range of about 0.5 micrometers to about 4 micrometers. The thickness BTk of the light shielding line BL1 may be defined as a distance from the top surface of the second line L2 to the top surface of the light shielding line BL1. The thickness BTk of the light shielding line BL1 may be the minimum thickness of the light shielding line BL1. As the thickness BTk of the light shielding line BL1 becomes greater than the thickness MTk of the second line L2, the second line L2 may be stably covered by the light shielding line BL1.

Figure 8A:
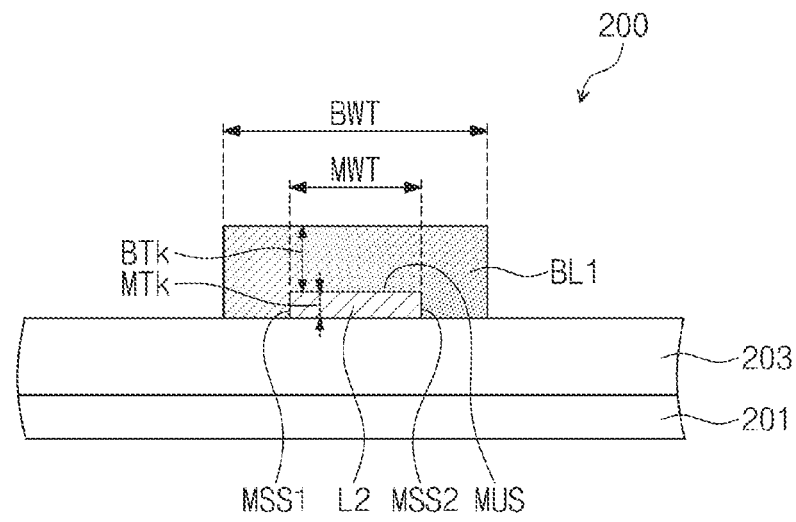
FIG. 8A is a cross-sectional view of a sensor layer taken along line II-II' of FIG. 6B, according to an embodiment of the present disclosure.
Figure 8A:
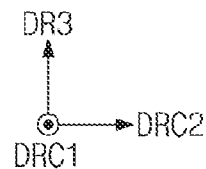

FIG. 8A is a cross-sectional view of the sensor layer 200 taken along line II-II' of FIG. 6B, according to an embodiment of the present disclosure.

Referring to FIGS. 6A, 6B, and 8A, each of the first mesh lines MSL1 and the second mesh lines MSL2 may include a top surface and side surfaces connected to the top surface. FIG. 8A representatively illustrates a top surface MUS and side surfaces MSS1 and MSS2 of the second line L2.

The width of each of the light shielding mesh lines BML may be greater than the width of each of the first mesh lines MSL1 and the second mesh lines MSL2. For example, a width BWT of the light shielding line BL1 may be greater than a width MWT of the second line L2. Accordingly, the second line L2 may be completely covered by the light shielding line BL1. In other words, the top surface MUS and the side surfaces MSS1 and MSS2 of the second line L2 may make contact (e.g., direct contact) with the light shielding line BL1 and may be covered by the light shielding line BL1. For example, the width BWT of the light shielding line BL1 may be in the range of about 3 micrometers to about 20 micrometers. The width MWT of the second line L2 may be less than the width BWT of the light shielding line BL1.

Figure 8B:
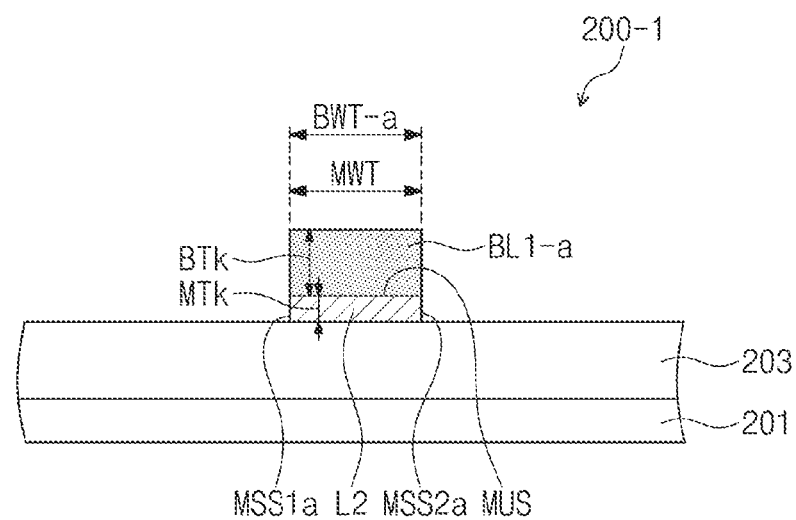
FIG. 8B is a cross-sectional view of a sensor layer taken along line II-II' of FIG. 6B, according to an embodiment of the present disclosure.
Figure 8B:
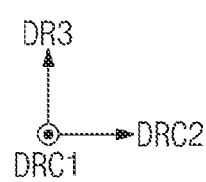

FIG. 8B is a cross-sectional view of a sensor layer 200-1 taken along line II-II' of FIG. 6B, according to an embodiment of the present disclosure.

Referring to FIGS. 6A, 6B, and 8B, the width of each of the light shielding mesh lines BML may be about equal to the width of each of the first mesh lines MSL1 and the second mesh lines MSL2. For example, a width BWT-a of a light shielding line BL1-a may be about equal to the width MWT of the second line L2.

The top surface MUS of the second line L2 may make contact (e.g., direct contact) with the light shielding line BL1-a and may be covered by the light shielding line BL1-a. In an embodiment, side surfaces MSS1a and MSS2a of the second line L2 are not covered by the light shielding line BL1-a. In this case, side surfaces MSS1a and MSS2a of the second line L2 may make direct contact with the adhesive layer AHL (refer to FIG. 3) or may make direct contact with a planarization layer 206 (refer to FIG. 11).

Figure 9:
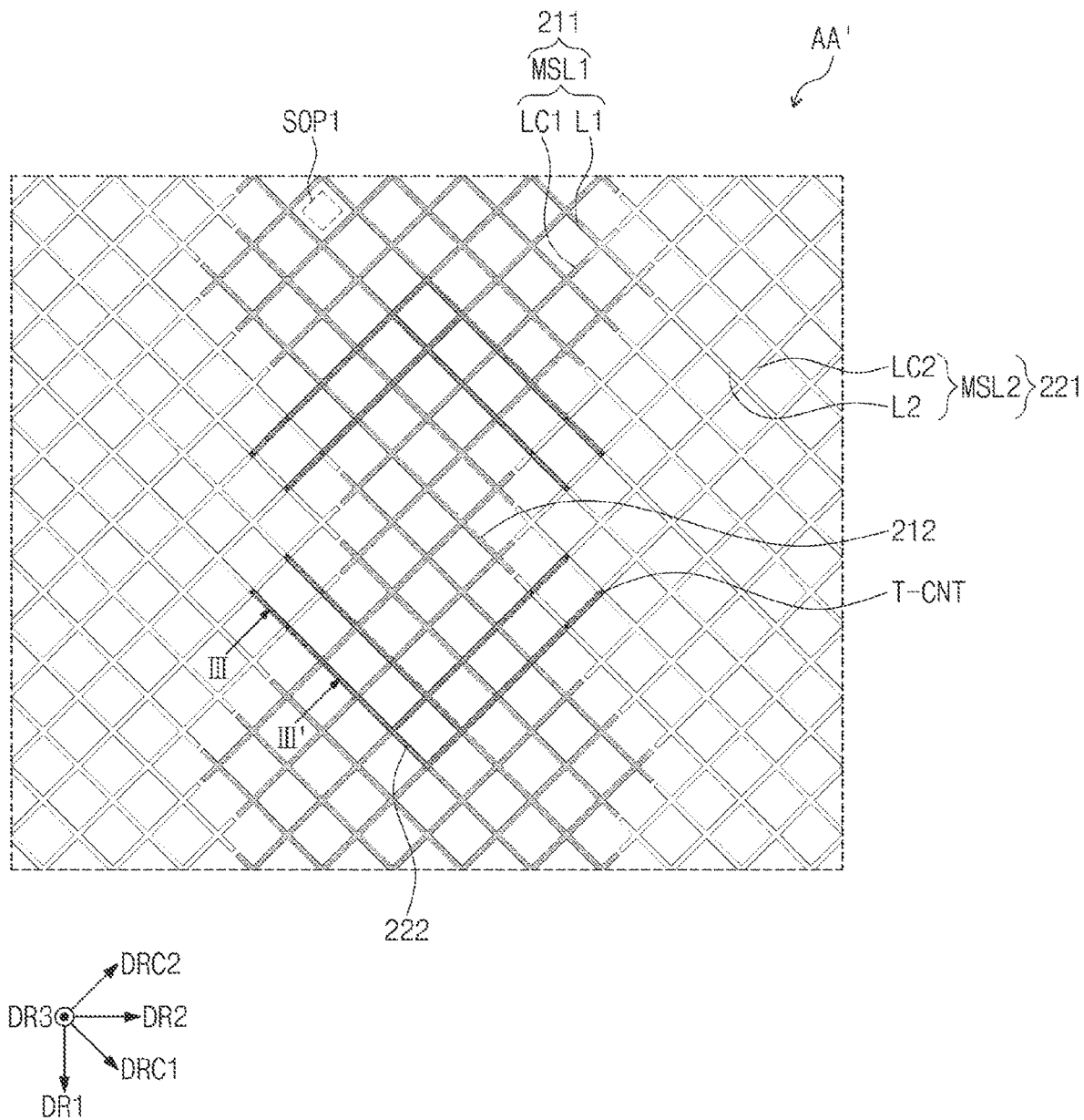
FIG. 9 is an expanded plan view of an area AA' illustrated in FIG. 5, according to an embodiment of the present disclosure.
Figure 10:
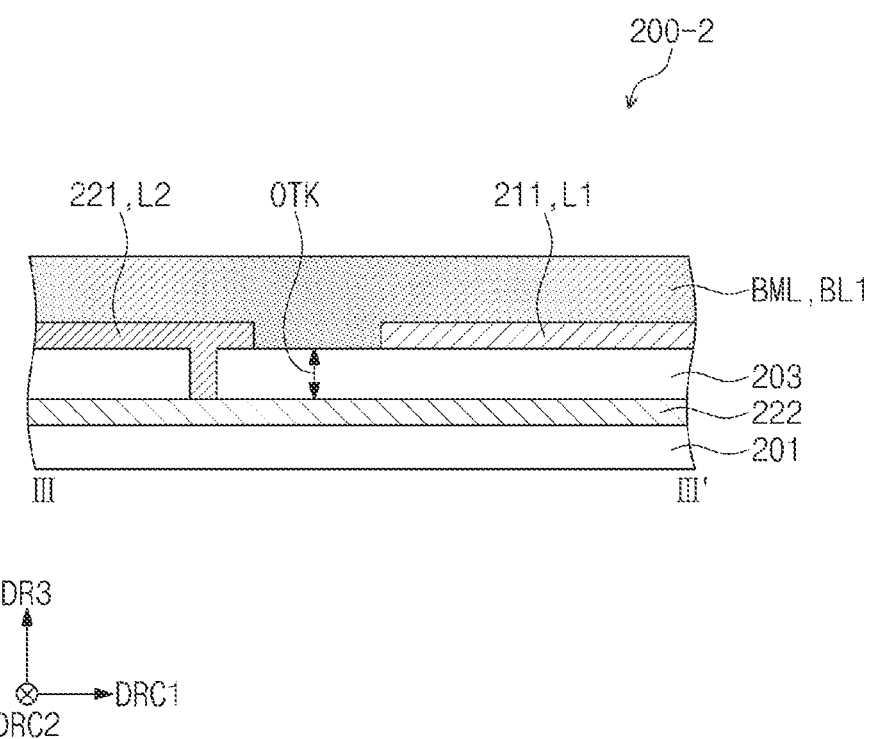
FIG. 10 is a cross-sectional view of a sensor layer taken along line III-III' of FIG. 9, according to an embodiment of the present disclosure.

FIG. 9 is an expanded plan view of an area AA' illustrated in FIG. 5, according to an embodiment of the present disclosure. FIG. 10 is a cross-sectional view of a sensor layer 200-2 taken along line III-III' of FIG. 9, according to an embodiment of the present disclosure.

Referring to FIGS. 5, 9, and 10, in an embodiment, the second opening SOP2 (see FIG. 6A) is not provided in the first sensing pattern 211. In other words, only the first opening SOP1 having substantially the same size may be defined in the first sensing pattern 211 according to an embodiment of the present disclosure. The first sensing pattern 211 may have a full mesh form in which the first sensing pattern 211 is continuously linked even at a portion overlapping the bridge pattern 222.

The sensing insulating layer 203 is disposed between the first sensing pattern 211 and the bridge pattern 222. The sensing insulating layer 203 may include an organic film. In this case, a thickness OTK of the sensing insulating layer 203 may be in the range of about 0.5 micrometers and about 4 micrometers. In this case, as the gap between the bridge pattern 222 and the first sensing pattern 211 is secured to be a specific distance or more by the sensing insulating layer 203 including an organic material, the possibility of mutual contact between the bridge pattern 222 and the first sensing pattern 211 may be reduced.

Figure 11:
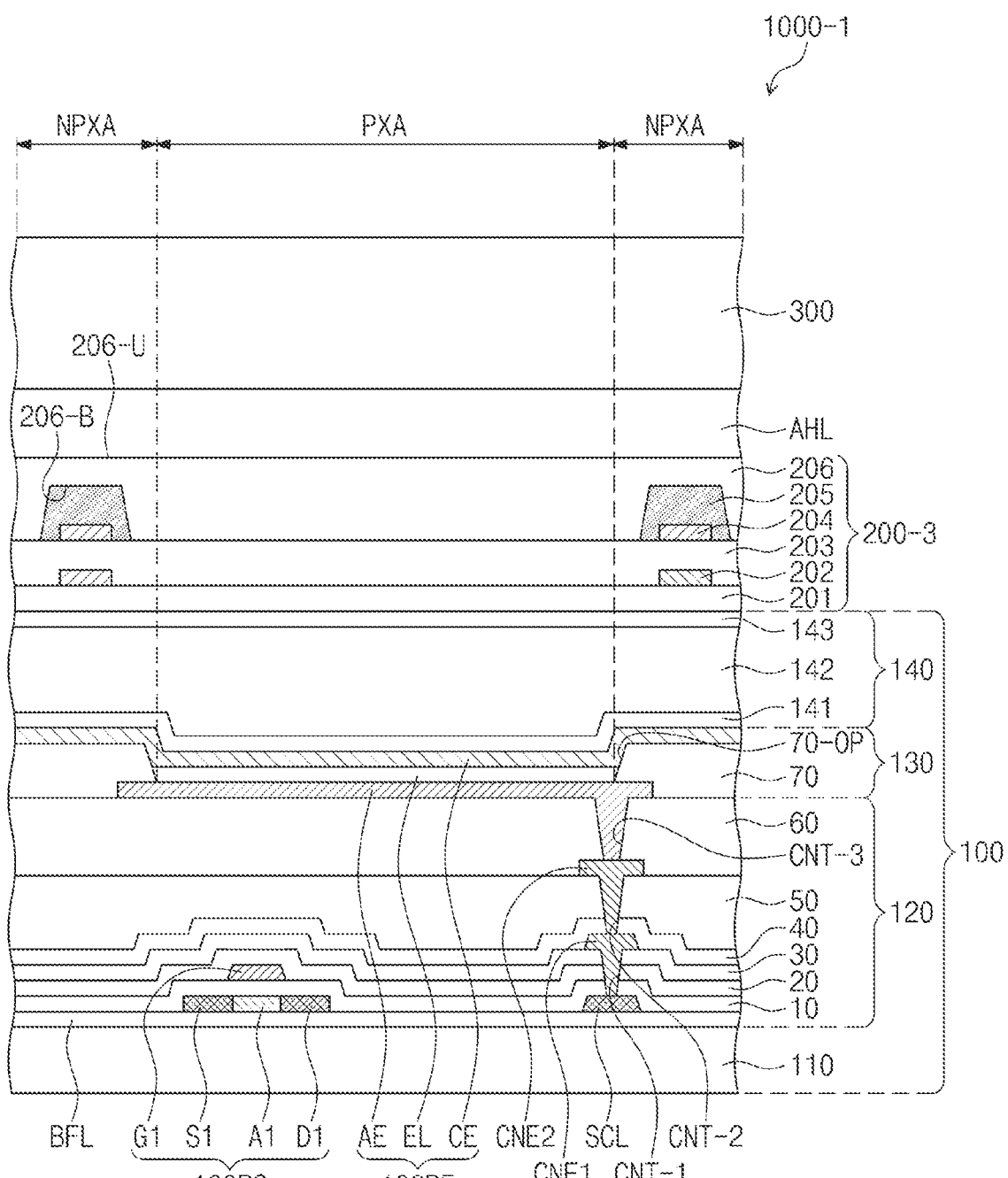
FIG. 11 is a cross-sectional view illustrating some components of an electronic device, according to an embodiment of the present disclosure.

FIG. 11 is a cross-sectional view illustrating some components of an electronic device 1000-1, according to an embodiment of the present disclosure.

Referring to FIG. 11, a sensor layer 200-3 may include a base layer 201, a first conductive layer 202, a sensing insulating layer 203, a second conductive layer 204, a light shielding pattern 205 and a planarization layer 206.

The planarization layer 206 may include a bottom surface 206-B, which is uneven, and a top surface 206-U, which is even. The bottom surface 206-B of the planarization layer 206 may have an uneven shape corresponding to the shape of the light shielding pattern 205. Accordingly, the planarization layer 206 may make direct contact with the light shielding pattern 205. For example, a portion of the bottom surface 206-B of the planarization layer 206 may make direct contact with the light shielding pattern 205, and another portion of the bottom surface 206-B of the planarization layer 206 may make direct contact with the sensing insulating layer 203. An adhesive layer AHL may make direct contact with the top surface 206-U of the planarization layer 206.

Figure 12:
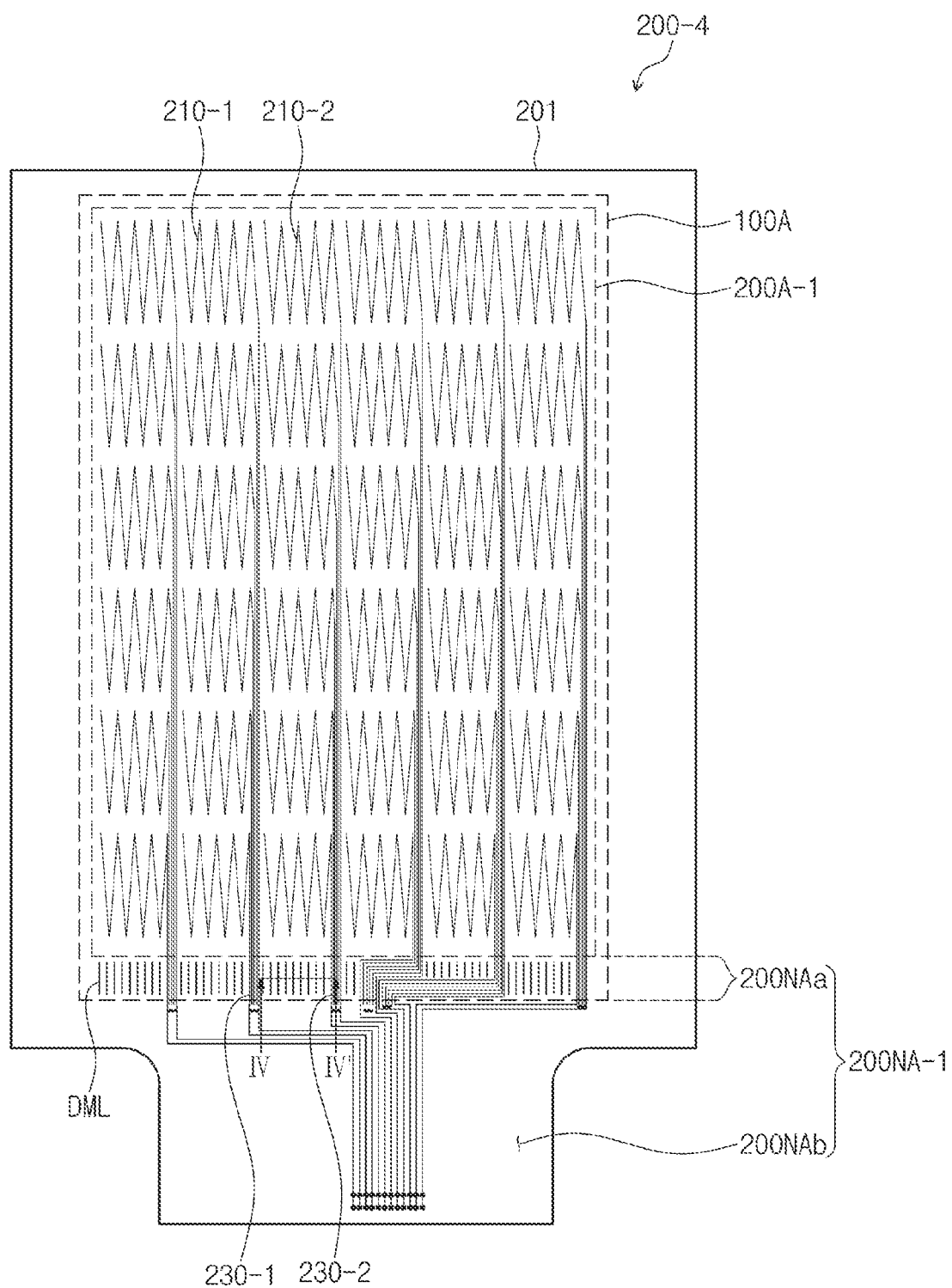
FIG. 12 is a plan view of a sensor layer, according to an embodiment of the present disclosure.

FIG. 12 is a plan view of a sensor layer 200-4, according to an embodiment of the present disclosure.

Referring to FIG. 12, a sensing area 200A-1 and a peripheral area 200NA-1 may be defined in the sensor layer 200-4. The sensing area 200A-1 may be an area activated in response to an electrical signal. The peripheral area 200NA-1 may be adjacent to the sensing area 200A-1, and in an embodiment, may surround the sensing area 200A-1.

FIG. 12 illustrates the display area 100A of the display layer 100 (see FIG. 11). The area of the sensing area 200A-1 may be less than the area of the display area 100A. Accordingly, a portion of the display area 100A may overlap the sensing area 200A-1, and another portion of the display area 100A may overlap the peripheral area 200NA-1. The peripheral area 200NA-1 may include a first peripheral area 200NAa that overlaps the display area 100A and a second peripheral area 200NAb that does not overlap the display area 100A.

The sensor layer 200-4 may include electrodes 210-1 and 210-2 and trace lines 230-1 and 230-2. The sensor layer 200-4 may acquire information on an external input through a change in self-capacitance.

The electrodes 210-1 and 210-2 may include a first sensing pattern 210-1 and a second sensing pattern 210-2 electrically isolated from the first sensing pattern 210-1, and the trace lines 230-1 and 230-2 may include a first trace line 230-1 connected to the first sensing pattern 210-1 and a second trace line 230-2 connected to the second sensing pattern 210-2.

The first and second trace lines 230-1 and 230-2 may extend from the sensing area 200A-1 toward the peripheral area 200NA-1. Accordingly, the first trace line 230-1 and the second trace line 230-2 may overlap the display area 100A and the non-display area 100NA.

The sensor layer 200-4 may further include dummy lines DML disposed in the first peripheral area 200NAa. The dummy lines DML may be disposed on an area having no first and second trace lines 230-1 and 230-2. Accordingly, in the display area 100A, the difference in the reflectance may be reduced between the area having the first and second trace lines 230-1 and 230-2 and the area having no first and second trace lines 230-1 and 230-2.

Figure 13A:
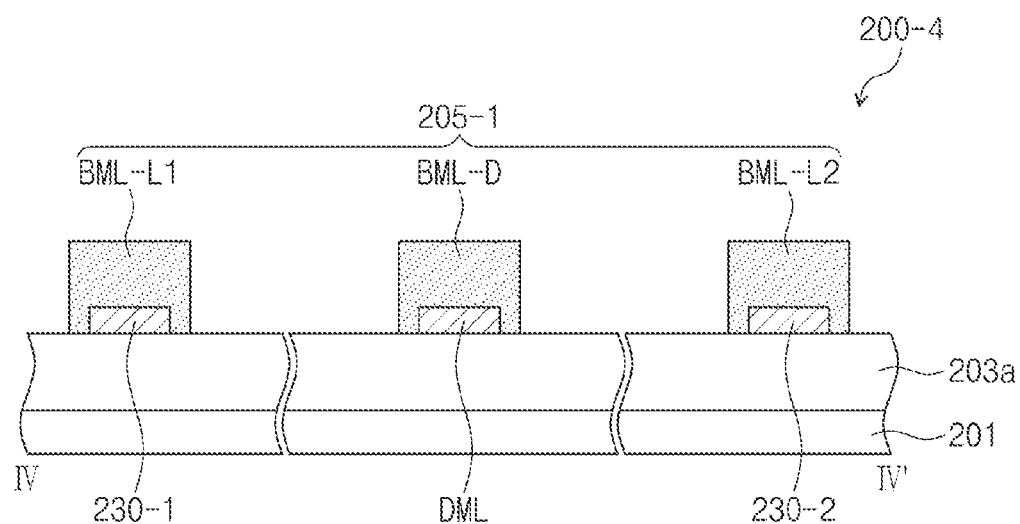
FIG. 13A is a cross-sectional view of a sensor layer taken along line IV-IV' of FIG. 12, according to an embodiment of the present disclosure.

FIG. 13A is a cross-sectional view of a sensor layer 200-4 taken along line IV-IV' of FIG. 12, according to an embodiment of the present disclosure.

Referring to FIGS. 12 and 13A, the first and second trace lines 230-1 and 230-2 and the dummy line DML may be disposed in the same layer. For example, the first and second trace lines 230-1 and 230-2 and the dummy line DML may be disposed on a sensing insulating layer 203a. The sensing insulating layer 203a may be disposed on the base layer 201. In an embodiment, a conductive layer is not interposed between the sensing insulating layer 203a and the base layer 201.

A light shielding pattern 205-1 includes light shielding mesh lines disposed on the first sensing pattern 210-1 and the second sensing pattern 210-2, a first light shielding line BML-L1, a second light shielding line BML-L2, and a light shielding dummy line BML-D.

The first light shielding line BML-L1 may overlap the first trace line 230-1 while covering the first trace line 230-1. The second light shielding line BML-L2 may overlap the second trace line 230-2 while covering the second trace line 230-2. The light shielding dummy line BML-D may overlap the dummy line DML while covering the dummy line DML.

According to an embodiment of the present disclosure, the first sensing pattern 210-1, the second sensing pattern 210-2, the first and second trace lines 230-1 and 230-2, and the dummy line DML may be covered by the light shielding pattern 205-1. Accordingly, external light may be absorbed by the light shielding pattern 205-1. Therefore, the first trace line 230-1 and the second trace line 230-2 may be prevented from being viewed. According to an embodiment of the present disclosure, the dummy line DML and the light shielding dummy line BML-D may be omitted.

Figure 13B:
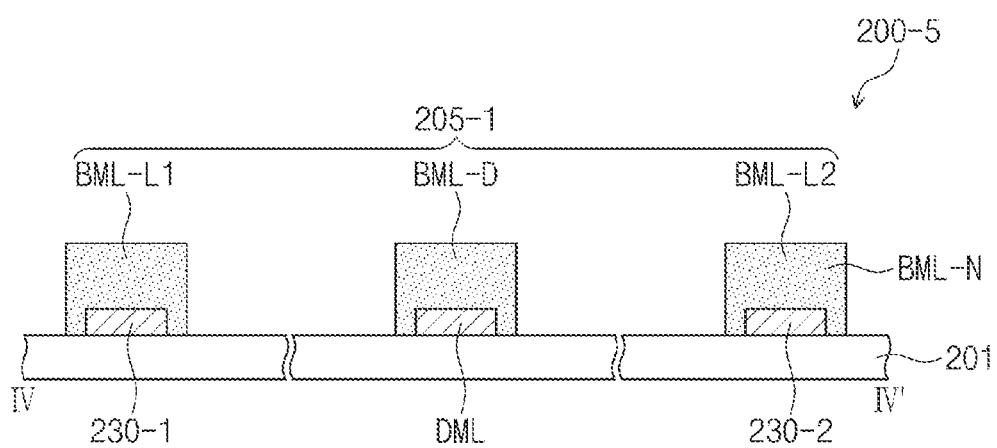
FIG. 13B is a cross-sectional view of a sensor layer taken along line IV-IV' of FIG. 12, according to an embodiment of the present disclosure.

FIG. 13B is a cross-sectional view of a sensor layer 200-5 taken along line IV-IV' of FIG. 12, according to an embodiment of the present disclosure.

Referring to FIGS. 12 and 13B, the first and second trace lines 230-1 and 230-2 and the dummy line DML may be disposed in the same layer. For example, the first and second trace lines 230-1 and 230-2 and the dummy line DML may be disposed on the base layer 201. The sensor layer 200-4 illustrated in FIG. 12 may be implemented in the form of a single conductive layer. Accordingly, the sensing insulating layer 203a described with reference to FIG. 13A may be omitted.

As described above, according to embodiments of the present disclosure, the first mesh lines of the first sensing pattern, the second mesh lines of the second sensing pattern, and the gaps between the first mesh lines and the second mesh lines may be covered by the light shielding mesh lines. In this case, according to embodiments of the present disclosure, the boundary between the first mesh lines and the second mesh lines is not viewable from the outside (e.g., is not viewable to a user).

Since the boundary between the first mesh lines and the second mesh lines is not viewable due to inclusion of the light shielding mesh lines, according to embodiments of the present disclosure, the cutting part is not provided in the first mesh lines and the second mesh lines. Accordingly, the plurality of first mesh lines constituting the first sensing pattern may be continuously linked to each other, and the plurality of second mesh lines constituting the second sensing pattern may be continuously linked to each other. Accordingly, the resistance between each of the electrodes and each of the cross electrodes may be reduced, thereby increasing the sensing performance of the sensor layer.

In addition, according to embodiments of the present disclosure, the electronic device may include the light shielding mesh lines, which cover the first mesh lines and the second mesh lines and the optical film. In addition, according to embodiments of the present disclosure, the reflectance of the incident light from the outside may be reduced by the optical film and the light shielding mesh lines. Accordingly, the black visibility of the electronic device may be increased according to embodiments of the present disclosure.

While the present disclosure has been described with reference to embodiments thereof, it will be apparent to those of ordinary skill in the art that various changes and modifications may be made thereto without departing from the spirit and scope of the present disclosure, as set forth in the following claims.

What is claimed is:

1. An electronic device, comprising:
a base layer;
a first sensing pattern disposed on the base layer and comprising a plurality of first mesh lines;
a second sensing pattern disposed on the base layer, spaced apart from the first sensing pattern, and comprising a plurality of second mesh lines; and
a light shielding pattern disposed on the plurality of first mesh lines and the plurality of second mesh lines, and comprising a plurality of light shielding mesh lines,
wherein the plurality of light shielding mesh lines overlaps gaps below the plurality of light shielding mesh lines and extending from one end of the plurality of first mesh lines to an opposing end of the plurality of second mesh lines.

2. The electronic device of claim 1, wherein the plurality of first mesh lines comprises:
a first line extending in a first crossing direction; and
a first crossing line, which extends in a second crossing direction crossing the first crossing direction,
wherein the plurality of second mesh lines comprises:
a second line, which extends in the first crossing direction and is spaced apart from the first line in the first crossing direction; and
a second crossing line extending in the second crossing direction,
wherein the plurality of light shielding mesh lines comprises:
a light shielding line extending in the first crossing direction; and
a crossing light shielding line extending in the second crossing direction,
wherein the light shielding line overlaps the first line, the second line, and a gap between the first line and the second line.

3. The electronic device of claim 1, wherein a width of each of the plurality of light shielding mesh lines is about equal to or greater than a width of each of the plurality of first mesh lines.

4. The electronic device of claim 1, wherein each of the plurality of first mesh lines comprises:
a top surface and side surfaces connected to the top surface,
wherein the top surface directly contacts one light shielding mesh line of the plurality of light shielding mesh lines.

5. The electronic device of claim 4, wherein the side surfaces are not covered by the one light shielding mesh line.

6. The electronic device of claim 4, wherein the top surface and the side surfaces connected to the top surface are covered by the one light shielding mesh line.

7. The electronic device of claim 1, further comprising:
an organic layer disposed between the first sensing pattern and the base layer, and between the second sensing pattern and the base layer; and
a bridge pattern disposed between the base layer and the organic layer and electrically connected to the second sensing pattern.

8. The electronic device of claim 7, wherein a thickness of the organic layer is equal to or greater than about 0.5 micrometers and is equal to or less than about 4 micrometers.

9. The electronic device of claim 7, wherein the first sensing pattern comprises:
a plurality of first openings; and
a second opening having a size greater than a size of each of the plurality of first openings,
wherein the second opening overlaps a portion of the bridge pattern.

10. The electronic device of claim 1, further comprising:
a polarizing film disposed on the light shielding pattern; and
an adhesive layer disposed between the light shielding pattern and the polarizing film,
wherein the adhesive layer comprises a bottom surface, which is uneven, and a top surface which is even,
wherein the light shielding pattern directly contacts the bottom surface of the adhesive layer,
wherein the polarizing film directly contacts the top surface of the adhesive layer.

11. The electronic device of claim 1, further comprising:
a planarization layer that covers the light shielding pattern and comprises a top surface which is even;
an adhesive layer disposed on the planarization layer and attached to the top surface of the planarization layer; and
a polarizing film disposed on the adhesive layer.

12. The electronic device of claim 1, further comprising:
a display layer disposed under the base layer and comprising:
a display area that displays an image; and
a non-display area adjacent to the display area,
wherein the first sensing pattern, the second sensing pattern, and the light shielding pattern overlap the display area.

13. The electronic device of claim 12, further comprising:
a first trace line disposed on the base layer and connected to the first sensing pattern; and
a second trace line disposed on the base layer and connected to the second sensing pattern,
wherein the light shielding pattern further comprises:
a first light shielding line and a second light shielding line overlapping the first trace line and the second trace line, respectively.

14. The electronic device of claim 13, wherein the first trace line, the second trace line, the first light shielding line, and the second light shielding line overlap the non-display area.

15. The electronic device of claim 13, wherein a portion of the first trace line, a portion of the second trace line, a portion of the first light shielding line, and a portion of the second light shielding line overlap the display area.

16. The electronic device of claim 15, further comprising:
a dummy line overlapping the display area and disposed between the first trace line and the second trace line,
wherein the light shielding pattern further comprises:
a light shielding dummy line overlapping the dummy line.

17. The electronic device of claim 1, wherein a minimum thickness of the plurality of light shielding mesh lines is greater than a thickness of the first mesh lines and a thickness of the second mesh lines,
wherein the minimum thickness of the plurality of light shielding mesh lines is in a range of about 0.5 micrometer to about 4 micrometers,
wherein each of the thickness of the first mesh lines and the thickness of the second mesh lines is in a range of about 0.2 micrometer to about 0.4 micrometers.

18. The electronic device of claim 1, wherein the plurality of first mesh lines constituting the first sensing pattern are continuously linked to each other,
wherein the plurality of second mesh lines constituting the second sensing pattern are continuously linked to each other.

19. An electronic device, comprising:
a display layer comprising a first base layer, a circuit layer disposed on the first base layer, a light emitting device layer disposed on the circuit layer, and an encapsulating layer disposed on the light emitting device layer;
a sensor layer comprising a second base layer directly disposed on the encapsulating layer, a plurality of sensing patterns disposed on the second base layer, and a light shielding pattern overlapping the plurality of sensing patterns; and
a polarizing film disposed on the sensor layer,
wherein the light shielding pattern directly contacts top surfaces of the plurality of sensing patterns,
wherein a minimum thickness of the light shielding pattern is greater than a thickness of each of the plurality of sensing patterns,
wherein the sensor layer further comprises:
a plurality of trace lines connected to the plurality of sensing patterns; and
a plurality of light shielding lines overlapping the plurality of trace lines.

20. The electronic device of claim 19, further comprising:
a planarization layer interposed between the sensor layer and the polarizing film, and
comprising a bottom surface, which is uneven, and a top surface which is even.

21. The electronic device of claim 19, wherein the sensor layer further comprises:
an organic layer disposed between the second base layer and the plurality of sensing patterns; and
a bridge pattern disposed between the second base layer and the organic layer, and electrically connected to at least one sensing pattern of the plurality of sensing patterns,
wherein a thickness of the organic layer is equal to or greater than about 0.5 micrometer and equal to or less than about 4 micrometers.

22. An electronic device, comprising:
a base layer;
a first sensing pattern disposed on the base layer and comprising a plurality of first mesh lines;
a second sensing pattern disposed on the base layer, spaced apart from the first sensing pattern, and comprising a plurality of second mesh lines;
a light shielding pattern disposed on the plurality of first mesh lines and the plurality of second mesh lines, and comprising a plurality of light shielding mesh lines,
wherein the plurality of light shielding mesh lines overlaps gaps between the plurality of first mesh lines and the plurality of second mesh lines;
an organic layer disposed between the first sensing pattern and the base layer, and between the second sensing pattern and the base layer; and
a bridge pattern disposed between the base layer and the organic layer and electrically connected to the second sensing pattern.

* * * * *